United States Patent
Dhar et al.

(10) Patent No.: US 6,765,061 B2
(45) Date of Patent: Jul. 20, 2004

(54) ENVIRONMENTALLY DURABLE, SELF-SEALING OPTICAL ARTICLES

(75) Inventors: Lisa Dhar, New Providence, NJ (US); Songvit Setthachayanon, Longmont, CO (US); Melinda Schnoes, Longmont, CO (US); Mark David Michaels, Colorado Springs, CO (US)

(73) Assignee: InPhase Technologies, Inc., Longmont, CO (US)

( * ) Notice: Subject to any disclaimer, the term of this patent is extended or adjusted under 35 U.S.C. 154(b) by 0 days.

(21) Appl. No.: 10/207,158

(22) Filed: Jul. 30, 2002

(65) Prior Publication Data

US 2003/0087104 A1 May 8, 2003

Related U.S. Application Data

(60) Provisional application No. 60/322,234, filed on Sep. 13, 2001.

(51) Int. Cl.$^7$ .............................................. C08G 18/10
(52) U.S. Cl. ...................... 525/123; 525/127; 525/131; 522/79; 359/3
(58) Field of Search ................................ 525/127, 123, 525/131; 522/79; 359/3

(56) References Cited

U.S. PATENT DOCUMENTS

| 4,138,299 A | * | 2/1979 | Bolgiano |
| 4,376,834 A | | 3/1983 | Goldwasser et al. |
| 5,317,076 A | | 5/1994 | Primeaux, II |
| 5,326,847 A | | 7/1994 | Burleigh et al. |
| 5,776,406 A | | 7/1998 | Schubert et al. |
| 5,985,986 A | | 11/1999 | Kubitza et al. |
| 6,103,454 A | * | 8/2000 | Dhar et al. |
| 6,160,645 A | | 12/2000 | Chandross et al. |

FOREIGN PATENT DOCUMENTS

| EP | 0 945 762 | 9/1999 |
| EP | 1 026 546 | 8/2000 |

* cited by examiner

Primary Examiner—Rachel Gorr
(74) Attorney, Agent, or Firm—Morrison & Foerster LLP

(57) ABSTRACT

Holographic articles having self-sealing properties such as moisture resistance and environmental durability are disclosed. The holographic articles are formed by the reaction of a composition containing an excess amount (i.e. non-stoichiometric amount) of polyisocyanates to polyols. The holographic recording articles exhibit high optical clarity and low scattering.

27 Claims, 2 Drawing Sheets

Figure 1

After 5 1/2 days in 95% RH

| Comp. Ex. 2 | Comp. Ex. 2 | Ex. 1 |
|---|---|---|
|  |  |  |

After 11 1/2 days in 95% RH

| Comp. Ex. 2 | Comp. Ex. 2 | Ex. 1 |
|---|---|---|
|  |  |  |

Outer non-flat rings

Figure 2

Outer non-flat rings

ENVIRONMENTALLY DURABLE, SELF-SEALING OPTICAL ARTICLES

RELATED APPLICATION

This application claims priority from U.S. Provisional Application 60/322,234, filed Sep. 13, 2001, which is entitled the same as this application.

FIELD OF THE INVENTION

The invention relates to optical articles including holographic recording media, in particular media useful either with holographic storage systems or as components such as optical filters or beam steerers. In particular, this invention relates to holographic recording compositions that are self-sealing and therefore moisture resistant and environmentally durable.

BACKGROUND

Developers of information storage devices and methods continue to seek increased storage capacity. As part of this development, so-called page-wise memory systems, in particular, a holographic system, have been suggested as alternatives to conventional memory devices.

A hologram stores data in three dimensions and reads an entire page of data at one time, i.e., page-wise, which is unlike an optical CD disk that stores data in two dimensions and reads a track at a time. Page-wise systems involve the storage and readout of an entire two-dimensional representation, e.g., a page, of data. Typically, recording light passes through a two-dimensional array of dark and transparent areas representing data, and the holographic system stores, in three dimensions, holographic representations of the pages as patterns of varying refractive index imprinted into a storage medium. Holographic systems are discussed generally in D. Psaltis et al., "Holographic Memories," *Scientific American*, Nov. 1995, the disclosure of which is hereby incorporated by reference. One method of holographic storage is phase correlation multiplex holography, which is described in U.S. Pat. No. 5,719,691 issued Feb. 17, 1998, the disclosure of which is hereby incorporated by reference.

The advantages of recording a hologram are high density (storage of hundreds of billions of bytes of data), high speed (transfer rate of a billion or more bits per second) and ability to select a randomly chosen data element in 100 microseconds or less. These advantages arise from three-dimensional recording and from simultaneous readout of an entire page of data at one time.

A hologram is a pattern, also known as a grating, which is formed when two laser beams interfere with each other in a light-sensitive material (LSM) whose optical properties are altered by the intersecting beams. One choice of a LSM is a photosensitive polymer film. See, e.g., W. K. Smothers et al., "Photopolymers for Holography," SPIE OE/Laser Conference, 1212-03, Los Angeles, Calif., 1990. The material described in this article contains a photoimageable system containing a liquid monomer material (a photoactive monomer) and a photoinitiator (which promotes the polymerization of the monomer upon exposure to light), where the photoimageable system is in an organic polymer host matrix that is substantially inert to the exposure light. During writing of information into the material (by passing recording light through an array representing data), the monomer polymerizes in the exposed regions.

U.S. Pat. No. 6,103,454 and application Ser. No. 09/046,822, the disclosures of which are hereby incorporated by reference, also relate to a photoimageable system in an organic polymer matrix. In particular, the application discloses a recording medium formed by polymerizing matrix material in situ from a fluid mixture of organic oligomer matrix precursor and a photoimageable system.

The conventional photoimageable holographic media having a crosslinked matrix formed by the reaction of polyisocyanates and polyols have been optimized for a matrix composition formed by the reaction of stoichiometric amounts of polyisocyanates to polyols. However, applicants unexpectedly found that a cross-linked matrix formed by the reaction of a composition containing an excess amount (i.e. non-stoichiometric amount) of polyisocyanates to polyols, once formed into holographic recording articles, exhibit high optical clarity, and low scattering.

SUMMARY OF THE INVENTION

This invention in high performance holographic recording articles is based on novel holographic articles containing crosslinked matrix formed from formulations containing an excess amount (i.e. non-stoichiometric amount) of polyisocyanates to polyols, which provide several advantages to the holographic performance of these media.

Applicants further found that when the polyols contain compounds such as fluorine, chlorine and silicon, the articles formed would also be optically clear, low scattering, and free of any the cloudiness and incompatibility commonly found in hydrocarbon systems mixing with the aforementioned fluorine, chlorine and silicon compounds. In the articles, the excess amount of polyisocyanates in the regions exposed to atmosphere or any moisture containing environment would react over time with the moisture to form a hard polyurea barrier.

Additional advantages of this invention would become readily apparent to those skilled in this art from the following detailed description, wherein only the preferred embodiments of this invention are shown and described, simply by way of illustration of the best mode contemplated for carrying out this invention. As would be realized, this invention is capable of other and different embodiments, and its details are capable of modifications in various obvious respects, all without departing from this invention. Accordingly, the drawings and description are to be regarded as illustrative in nature and not as restrictive.

DETAILED DESCRIPTION OF THE INVENTION

This invention relates to optical articles that are self-sealing and therefore moisture resistant and environmentally durable. In the context of this invention, an optical article is self-sealing if it produces a barrier against moisture incursions and a barrier that promotes environmental durability through the reaction (either chemical or physical) of components of the optical article and environmentally present components such as water, oxygen or other commonly present components.

In the preferred embodiment, for example, in holographic recording articles where the holographic recording compositions are sandwiched between substrates, a polyurea barrier would be formed as a frame in the areas that are exposed to moisture. The isocyanate (NCO) and moisture reaction proceeds according to the reaction scheme below:

R—NCO+$H_2$O→R—$NH_2$+$CO_2$↑

R—$NH_2$+R—NCO→R—NH—CO—NH—R

The polyurea linkage alone functions as a barrier to moisture or could be coupled with the hydrophobicity of, for example, fluorinated polyols to provide improved environmental protection for the optical articles. In the case of holographic recording articles, the articles maintain their archival capability, optical flatness and clarity even when exposed to high humidity environments.

The optical article, e.g., holographic recording medium, of the invention is formed by steps including mixing a matrix precursor and a photoactive material, preferably a photoactive monomer, and curing the mixture to form the matrix in situ. The matrix precursor and photoactive monomer are selected such that (a) the reaction by which the matrix precursor is polymerized during the cure is independent from the reaction by which the photoactive monomer will be polymerized during writing of a pattern, e.g., data, and (b) the matrix polymer and the polymer resulting from polymerization of the photoactive monomer (the photopolymer) are compatible with each other. As discussed previously, the matrix is considered to be formed when the photorecording material, i.e., the matrix material plus the photoactive monomer, photoinitiator, and/or other additives, exhibits an elastic modulus of at least about $10^5$ Pa, generally about $10^5$ Pa to about $10^9$ Pa, advantageously about $10^6$ Pa to about $10^8$ Pa.

The compatibility of the matrix polymer and photopolymer tends to prevent large-scale (>100 nm) phase separation of the components, such large-scale phase separation typically leading to undesirable haziness or opacity. Utilization of a photoactive monomer and a matrix precursor that polymerize by independent reactions provides a cured matrix substantially free of cross-reaction, i.e., the photoactive monomer remains substantially inert during the matrix cure. In addition, due to the independent reactions, there is no inhibition of subsequent polymerization of the photoactive monomer. The resulting optical article is capable of exhibiting desirable refractive index contrast due to the independence of the matrix from the photoactive monomer.

The optical article is capable of exhibiting desirable refractive index contrast due to the independence of the matrix from the photoactive monomer. As discussed above, formation of a hologram, waveguide, or other optical article relies on a refractive index contrast (An) between exposed and unexposed regions of a medium, this contrast is at least partly due to monomer diffusion to exposed regions. High index contrast is desired because it provides improved signal strength when reading a hologram, and provides efficient confinement of an optical wave in a waveguide. One way to provide high index contrast in the invention is to use a photoactive monomer having moieties (referred to as index-contrasting moieties) that are substantially absent from the matrix, and that exhibit a refractive index substantially different from the index exhibited by the bulk of the matrix. For example, high contrast would be obtained by using a matrix that contains primarily aliphatic or saturated alicyclic moieties with a low concentration of heavy atoms and conjugated double bonds (providing low index) and a photoactive monomer made up primarily of aromatic or similar high-index moieties.

The matrix is a solid polymer formed in situ from a matrix precursor by a curing step (curing indicating a step of inducing reaction of the precursor to form the polymeric matrix). It is possible for the precursor to be one or more monomers, one or more oligomers, or a mixture of monomer and oligomer. In addition, it is possible for there to be greater than one type of precursor functional group, either on a single precursor molecule or in a group of precursor molecules. (Precursor functional groups are the group or groups on a precursor molecule that are the reaction sites for polymerization during matrix cure.) To promote mixing with the photoactive monomer, the precursor is advantageously liquid at some temperature between about −50° C. and about 80° C. Advantageously, the matrix polymerization is capable of being performed at room temperature. Also advantageously, the polymerization is capable of being performed in a time period less than 5 minutes. The glass transition temperature ($T_g$) of the photorecording material is advantageously low enough to permit sufficient diffusion and chemical reaction of the photoactive monomer during a holographic recording process. Generally, the $T_g$ is not more than 50° C. above the temperature at which holographic recording is performed, which, for typical holographic recording, means a $T_g$ between about 80° C. and about −130° C. (as measured by conventional methods). It is also advantageous for the matrix to exhibit a three-dimensional network structure, as opposed to a linear structure, to provide the desired modulus discussed previously.

Examples of polymerization reactions contemplated for forming matrix polymers in the invention include cationic epoxy polymerization, cationic vinyl ether polymerization, cationic alkenyl ether polymerization, cationic allene ether polymerization, cationic ketene acetal polymerization, epoxy-amine step polymerization, epoxy-mercaptan step polymerization, unsaturated ester-amine step polymerization (via Michael addition), unsaturated ester-mercaptan step polymerization (via Michael addition), vinyl-silicon hydride step polymerization (hydrosilylation), isocyanate-hydroxyl step polymerization (urethane formation), and isocyanatae-amine step polymerization (urea formation).

Several such reactions are enabled or accelerated by suitable catalysts. For example, cationic epoxy polymerization takes place rapidly at room temperature by use of $BF_3$-based catalysts (or other Lewis acids), other cationic polymerizations proceed in the presence of protons, epoxy-mercaptan reactions and Michael additions are accelerated by bases such as amines, hydrosilylation proceeds rapidly in the presence of transition metal catalysts such as platinum, and urethane and urea formation proceed rapidly when tin catalysts are employed. It is also possible to use photogenerated catalysts for matrix formation, provided that steps are taken to prevent polymerization of the photoactive monomer during the photogeneration.

Holographic recording article compositions comprises the following ingredients:

| | |
|---|---|
| Polyisocyanates | 20–50 Wt % |
| Acrylate Monomers | 1–15 Wt % |
| Photoinitiators | 0.2–3 Wt % |
| Polyols | 40–80 Wt % |
| Catalysts | 0.1–3 Wt % |
| Additives | 0.001–0.5 Wt % |

Polyisocyanates are aliphatic or cycloaliphatic with two and higher functionalities. Examples are hexamethylene diisocyanate (HDI), trimethylhexamethyle diisocyanates (TMDI), isophorone diisocyanate (IPDI), bis(4-isocyanatocyclohexyl)methane (HMDI), and tetramethylxylylene diisocyanate (TMXDI). Optionally oligomers with NCO-terminated functionality can also be used. Preferred polyisocyanates are hexamethylene diisocyanate(HDI) and its biuret, uretidione, and isocyanuate derivatives.

The NCO-terminated prepolymers are selected from the by-products of diols and diisocyanates that have wt % contents of NCO in the range of 10 to 25. The NCO contents were determined based on the prepolymer, unreacted diisocyanate and optionally added neat polyisocyanates to achieve the high performance characteristics. Aromatic diisocynates based prepolymers could also be used.

Polyols are selected from diols and triols of polytetramethylene glycol, polycaprolactone, polypropylene oxide and other polyether and polyester polyols. Preferred polyols are polypropylene oxide triols with molecular weight ranging from 450 to 6,000 and polytetramethylene glycol with molecular weight from 600 to 3,000. Preferably, the polyols are free of moisture contents for the initial reaction with the excess amount of polyisocyanates to assure bubble-free matrix systems are formed. High temperature vacuum distillation treatments or additives such as moisture scavengers or catalysts which only promote reaction of isocynates to hydroxyl other than water may be used to assure no water residue remains in the polyols before use.

For polyols containing elements other than carbon, oxygen and hydrogen, fluorinated, siliconated and chlorinated polyols are available to react with the excess amount of polyisocyanates. In the case of fluorinated polyols, to achieve high optical quality (void of any haziness and opacity) and performance, the polyols are selected from fluorinated polyether diols. Other fluorinated polyols can also be used. These include, but not limited to, polyols containing trifluoromethyl, trifluoroethyl, or tetrafluoroethyl moieties in the polymer main or branched chains. Preferred fluorinated diols are polyether diols prepared from oxetane chemistry with molecular weights from 350 to 4500, preferably from 1500 to 4200, and percent fluorine by weight from 10 to 40%. One fluorinated oxetane oligomer diol is available commercially from Omnova Solutions Inc. under the trade name PolyFox™ T with about 3800 molecular weight containing 31% weight percent of fluorine. It is desirable to blend the fluorinated polyols with non-fluorinated polyols to achieve desired physical and chemical performance characteristics. Choices of these polyols can be the diols and triols of polytetramethylene glycol, polycaprolactone, polypropylene oxide and polyester polyols with molecular weights ranging from 450 to 6000.

Excess NCO to OH ratios is employed to form the thermally cross-linked matrix. Ranges of NCO/OH are from 1.01/1.0 to 4.0/1.0. Preferably the ranges are from 1.1/1.0 to 2.1/1.0.

A photoactive material could be any material, preferably a photoactive monomer, capable of undergoing a reaction, preferably photoinitiated polymerization, by exposure to light. Furthermore, if the photoactive material is a photoactive monomer, then the photoactive monomer, in combination with matrix materials, meets the polymerization reaction and compatibility requirements of the invention.

Suitable photoactive monomers include those which polymerize by a free-radical reaction, e.g., molecules containing ethylenic unsaturation such as acrylates, methacrylates, acrylamides, methacrylamides, styrene, substituted styrenes, vinyl naphthalene, substituted vinyl naphthalenes, and other vinyl derivatives. The preferred acrylate monomers are monofunctional. These include 2,4,6-tribromophenylacrylate, pentabromoacrylate, isobornylacrylate, phenylthioethyl acrylate tetrahydrofurfurylacrylate, 1-vinyl-2-pyrrolidinone, asymmetric bis thionapthyl acrylate, 2-phenoxyethylacrylate, and the like.

Free-radical copolymerizable pair systems such as vinyl ether mixed with maleate and thiol mixed with olefin are also suitable. It is also possible to use cationically polymerizable systems such as vinyl ethers, alkenyl ethers, allene ethers, ketene acetals, and epoxies. It is also possible for a single photoactive monomer molecule to contain more than one monomer functional group. As mentioned previously, relatively high index contrast is desired in the article of the invention, whether for improved readout in a recording media or efficient light confinement in a waveguide. In addition, it is advantageous to induce this relatively large index change with a small number of monomer functional groups, because polymerization of the monomer generally induces shrinkage in a material.

Such shrinkage has a detrimental effect on the retrieval of data from stored holograms, and also degrades the performance of waveguide devices such as by increased transmission losses or other performance deviations. Lowering the number of monomer functional groups that must be polymerized to attain the necessary index contrast is therefore desirable. This lowering is possible by increasing the ratio of the molecular volume of the monomers to the number of monomer functional groups on the monomers. This increase is attainable by incorporating into a monomer larger index-contrasting moieties and/or a larger number of index-contrasting moieties. For example, if the matrix is composed primarily of aliphatic or other low index moieties and the monomer is a higher index species where the higher index is imparted by a benzene ring, the molecular volume could be increased relative to the number of monomer functional groups by incorporating a naphthalene ring instead of a benzene ring (the naphthalene having a larger volume), or by incorporating one or more additional benzene rings, without increasing the number of monomer functional groups. In this manner, polymerization of a given volume fraction of the monomers with the larger molecular volume/monomer functional group ratio would require polymerization-of less monomer functional groups, thereby inducing less shrinkage. But the requisite volume fraction of monomer would still diffuse from the unexposed region to the exposed region, thus providing the desired refractive index.

The molecular volume of the monomer, however, should not be so large as to slow diffusion below an acceptable rate. Diffusion rates are controlled by factors including size of diffusing species, viscosity of the medium, and intermolecular interactions. Larger species tend to diffuse more slowly, but it would be possible in some situations to lower the viscosity or make adjustments to the other molecules present in order to raise diffusion to an acceptable level. Also, in accord with the discussion herein, it is important to ensure that larger molecules maintain compatibility with the matrix.

Numerous architectures are possible for monomers containing multiple index-contrasting moieties. For example, it is possible for the moieties to be in the main chain of a linear oligomer, or to be substituents along an oligomer chain. Alternatively, it is possible for the index-contrasting moieties to be the subunits of a branched or dendritic low molecular weight polymer.

In addition to the photoactive monomer, the optical article typically contains a photoinitiator (the photoinitiator and photoactive monomer being part of the overall photoimageable system). The photoinitiator, upon exposure to relatively low levels of the recording light, chemically initiates the polymerization of the monomer, avoiding the need for direct light-induced polymerizatioin of the monomer. The photoinitiator generally should offer a source of species that initiate polymerization of the particular photoactive monomer. Typically, 0.01 to 20 wt. % photoinitiator, based on the weight of the photoimageable system, provides desirable results.

A variety of photoinitiators known to those skilled in the art and available commercially are suitable for use in the invention. Photoinitiators are selected according to their sensitivity to the light sources. For example, Irgacure 369, Irgacure 819, ITX, and Irgacure 907 are suitable for commercial blue laser systems. CGI-784 is suitable for green laser systems, and CB-650 is suitable for red laser systems. Irgacure and CGI are available from Ciba, CB-650 from Spectra Group. CGI-784 is bis(η-5-2,4-cyclopentadien-1-yl) bis[2,6-difluoro-3-(1H-pyrrol-1-yl)phenyl]titanium.

The photoinitiating systems of this invention could further comprise UV initiators from Ciba Specialty Chemicals (CSC) that have absorption maxima at UV wavelengths and absorption tails that stretch into the blue region of the electromagnetic spectrum between 400 and 500 nm. These include Darocur® 4265, Irgacure® 184, Irgacure® 369, Irgacure® 1800, Irgacure® 2020, and Irgacure® 819, with the last being preferred. Some of the photoinitiators available from CSC that could be used in this invention have the following properties.

Irgacure® 819 is a phosphine oxide photoinitiator in which the absorption is strong from 440 nm (visible blue) and lower in the UV spectrum.

Irgacure 819

Irgacure® 819XF is a finely ground version of Irgacure® 819 which dissolves much more rapidly in common acrylate monomers.

Irgacure® 2020 is a liquid phosphine oxide containing photoinitiator.

Irgacure® 1300 is a fast dissolving alpha-hydroxy ketone based photo initiator with improved solubility as compared to Irgacure® 369.

Irgacure® 184 is a non-yellowing solid photoinitiator useful as a co-initiator in many formulations.

Darocur® 1173 is a non-yellowing liquid photoinitiator with low viscosity. Good solvency properties make it useful in blends with other photoinitiators.

Irgacure® 500 is a liquid blend of benzophenone and Irgacure® 184. Due to the inclusion of benzophenone in this eutectic mixture, the formulation should contain an extractable hydrogen donating component to achieve optimal performance.

Irgacure® 651 is a general purpose solid UV photoinitiator useful in formulations containing styrene and where post yellowing is not a concern.

Darocur® 4265 is a liquid photoinitiator comprising a blend of Darocur® 1173 and Lucirin® TPO. Lucirin® TPO is a product of BASF.

Irgacure® 2959 is a very low odor and low volatility photoinitiator. It contains a terminal OH group, which may provide a site for additional reactions.

Other photoinitiators from CSC include Irgacure® 369, Irgacure® 1800 and Irgacure® 1700.

The above photo initiators could be used alone or in combination with another initiator.

Also, diphenyl (2,4,6-trimethylbenzoyl)phosphine oxide, which is not from CSC but can be obtained from Aldrich could be used as a photoinitiator. This is a phosphine oxide similar to Irgacure® 819, but having lower absorbance in the blue region of the spectrum. The formula of DTBPO is the following:

Preferably, tin catalysts are used. These are dialkyltinlaurates, dialkyltindilaurates, stannous octoate, dialkyltin carboxylates, dialkyltin mercaptides, mercury-based tin compounds, and others.

Additives include thermal stabilizers such as butyrated hydroxytoluene (BHT), phenothiazine, hydroquinone, and methylether of hydroquinone; reducers such as peroxides, phosphites, and hydroxyamines; and deformers or deaerators to eliminate entrapped air bubbles.

For purposes of the invention, polymers are considered to be compatible if a blend of the polymers is characterized, in 90° light scattering, by a Rayleigh ratio ($R_{90}°$) less than $7 \times 10^{-3}$ cm$^{-1}$. The Rayleigh ratio, $R_\theta$, is a conventionally known property, and is defined as the energy scattered by a unit volume in the direction θ, per steradian, when a medium is illuminated with a unit intensity of unpolarized light, as discussed in M. Kerker, *The Scattering of Light and Other Electromagnetic Radiation*, Academic Press, San Diego, 1969. The light source used for the measurement is generally a laser having a wavelength in the visible part of the spectrum. Normally, the wavelength intended for use in writing holograms is used. The scattering measurements are made upon a photorecording material that has been flood exposed. The scattered light is collected at an angle of 90° from the incident light, typically by a photodetector. It is possible to place a narrowband filter, centered at the laser wavelength, in front of such a photodetector to block fluorescent light, although such a step is not required. The Rayleigh ratio is typically obtained by comparison to the energy scatter of a reference material having a known Rayleigh ratio.

Polymer blends which are considered to be miscible, e.g., according to conventional tests such as exhibition of a single glass transition temperature, will typically be compatible as well, i.e., miscibility is a subset of compatibility. Standard miscibility guidelines and tables are therefrom useful in selecting a compatible blend. However, it is possible for polymer blends that are immiscible to be compatible according to the light scattering test above.

A polymer blend is generally considered to be miscible if the blend exhibits a single glass transition temperature, $T_g$, as measured by conventional methods. An immiscible blend will typically exhibit two glass transition temperatures corresponding to the $T_g$ values of the individual polymers. $T_g$ testing is most commonly performed by differential scanning calorimetry (DSC), which shows the $T_g$ as a step change in the heat flow (typically the ordinate). The reported $T_g$ is typically the temperature at which the ordinate reaches the mid-point between extrapolated baselines before and after the transition. It is also possible to use Dynamic Mechanical Analysis (DMA) to measure $T_g$. DMA measures the storage modulus of a material, which drops several orders of magnitude in the glass transition region. It is possible in certain cases for the polymers of a blend to have individual $T_g$ values that are close to each other. In such cases, conventional methods for resolving such overlapping $T_g$ should be used, such as discussed in Brinke et al., "The thermal characterization of multi-component systems by enthalpy relaxation," *Thermochimica Acta.*, 238 (1994), at 75.

Matrix polymer and photopolymer that exhibit miscibility are capable of being selected in several ways. For example, several published compilations of miscible polymers are available, such as O. Olabisi et al, *Polymer-Polymer Miscibility*, Academic Press, New York, 1979; L. M. Robeson, *MMI, Press Symp. Ser.*, 2, 177, 1982; L. A. Utracki, *Polymer Alloys and Blends: Thermodynamics and Rheology*, Hanser Publishers, Munich, 1989; and S. Krause in *Polymer Handbook*, J. Brandrup and E. H. Immergut, Eds., 3rd Ed., Wiley Interscience, New York, 1989, pp. VI 347–370, the disclosures of which are hereby incorporated by reference. Even if a particular polymer of interest is not found in such references, the approach specified allows determination of a compatible photorecording material by employing a control sample.

Determination of miscible or compatible blends is further aided by intermolecular interaction considerations that typically drive miscibility. For example, it is well known that polystyrene and poly(methylvinylether) are miscible because of an attractive interaction between the methyl ether group and the phenyl ring. It is therefore possible to promote miscibility, or at least compatibility, of two polymers by using a methyl ether group in one polymer and a phenyl group in the other polymer. It has also been demonstrated that immiscible polymers are capable of being made miscible by the incorporation of appropriate functional groups that can provide ionic interactions. (See Z. L. Zhou and A. Eisenberg, *J. Polym. Sci., Polym. Phys. Ed.*, 21 (4), 595, 1983; R. Murali and A. Eisenberg, *J. Polym. Sci., Part B: Polym. Phys.*, 26 (7), 1385, 1988; and A Natansohn et al., *Makromol. Chem., Macromol. Symp.*, 16, 175, 1988). For example polyisoprene and polystyrene are immiscible. However, when polyisoprene is partially sulfonated (5%), and 4-vinyl pyridine is copolymerized with the polystyrene, the blend of these two functionalized polymers is miscible. It is contemplated that the ionic interaction between the sulfonated groups and the pyridine group (proton transfer) is the driving force that makes this blend miscible. Similarly, polystyrene and poly(ethyl acrylate), which are normally immiscible, have been made miscible by lightly sulfonating the polystyrene. (See R. E. Taylor-Smith and R. A. Register, *Macromolecules*, 26, 2802, 1993.) Charge-transfer has also been used to make miscible polymers that are otherwise immiscible. For example it has been demonstrated that, although poly(methyl acrylate) and poly(methyl methacrylate) are immiscible, blends in which the former is copolymerized with (N-ethylcarbazol-3-yl)methyl acrylate (electron donor) and the latter is copolymerized with 2-[(3, 5-dinitrobenzoyl)oxy]ethyl methacrylate (electron acceptor) are miscible, provided the right amounts of donor and acceptor are used. (See M. C. Piton and A. Natansohn, *Macromolecules*, 28, 15, 1995.) Poly(methyl methacrylate) and polystyrene are also capable of being made miscible using the corresponding donor-acceptor co-monomers (See M. C. Piton and A. Natansohn, *Macromolecules*, 28, 1605, 1995).

A variety of test methods exist for evaluating the miscibility or compatibility of polymers, as reflected in the recent overview published in A. Hale and H. Bair, Ch. 4—"Polymer Blends and Block Copolymers," *Thermal Characterization of Polymeric Materials*, 2nd Ed., Academic Press, 1997. For example, in the realm of optical methods, opacity typically indicates a two-phase material, whereas clarity generally indicates a compatible system. Other methods for evaluating miscibility include neutron scattering, infrared spectroscopy (IR), nuclear magnetic resonance (NMR), x-ray scattering and diffraction, fluorescence, Brillouin scattering, melt titration, calorimetry, and chemilluminescence. See, for example, L. Robeson, supra; S. Krause, *Chemtracts—Macromol. Chem.*, 2, 367, 1991 a; D. Vessely in *Polymer Blends and Alloys*, M. J. Folkes and P. S. Hope, Eds., Blackie Academic and Professional, Glasgow, pp. 103–125; M. M. Coleman et al. *Specific Interactions and the Miscibility of Polymer Blends*, Technomic Publishing, Lancaster, Pa., 1991; A. Garton, *Infrared Spectroscopy of Polymer Blends, Composites and Surfaces*, Hanser, N.Y., 1992; L. W. Kelts et al., *Macromolecules*, 26, 2941, 1993; and J. L. White and P. A. Mirau, *Macromolecules*, 26, 3049, 1993; J. L. White and P. A. Mirau, *Macromolecules*, 27, 1648, 1994; and C. A. Cruz et al., *Macromolecules*, 12, 726, 1979; and C. J. Landry et al., *Macromolecules*, 26, 35, 1993.

Compatibility has also been promoted in otherwise incompatible polymers by incorporating reactive groups into the polymer matrix, where such groups are capable of reacting with the photoactive monomer during the holographic recording step. Some of the photoactive monomer will thereby be grafted onto the matrix during recording. If there are enough of these grafts, it is possible to prevent or reduce phase separation during recording. However, if the refractive index of the grafted moiety and of the monomer are relatively-similar, too many grafts, e.g., more than 30% of monomers grafted to the matrix, will tend to undesirably reduce refractive index contrast.

The fabrication of a high-performance recording article requires forming a matrix polymer in which a photoactive material, preferably a photoactive monomer, is dispersed either uniformly, randomly or selectively at certain locations. Typically, fabrication of an optically flat medium involves depositing the matrix precursor/photoimageable system mixture between two plates using, for example, a gasket to contain the mixture. The plates are typically glass, but it is also possible to use other materials transparent to the radiation used to write data, e.g., a plastic such as polycarbonate or poly(methyl methacrylate). It is possible to use spacers between the plates to maintain a desired thickness for the recording medium. During the matrix cure, it is possible for shrinkage in the material to create stress in the plates, such stress altering the parallelism and/or spacing of the plates and thereby detrimentally affecting the medium's optical properties. To reduce such effects, it is useful to place the plates in an apparatus containing mounts, e.g., vacuum chucks, capable of being adjusted in response to changes in parallelism and/or spacing. In such an apparatus, it is possible to monitor the parallelism in real-time by use of a conventional interferometric method, and make any necessary adjustments during the cure. Such a method is discussed, for example, in U.S. patent application Ser. No. 08/867,563, U.S. Pat. No. 5,932,045 the disclosure of which are hereby incorporated by reference. The photorecording material of the invention is also capable of being supported in other ways. For instance, it is conceivable to dispose the matrix precursor/photoimageable system mixture into the pores of a substrate, e.g., a nanoporous glass material such as Vycor, prior to matrix cure. More conventional polymer processing is also invisioned, e.g., closed mold formation or sheet extrusion. A stratified medium is also contemplated, i.e., a medium containing multiple substrates, e.g., glass, with layers of photorecording material disposed between the substrates.

The medium of the invention is then capable of being used in a holographic system such as discussed previously. The amount of information capable of being stored in a holographic medium is proportional to the product of: the refractive index contrast, $\Delta n$, of the photorecording material, and the thickness, d, of the photorecording material. The refractive index contrast, $\Delta n$, is conventionally known, and is defined as the amplitude of the sinusoidal variations in the refractive index of a material in which a plane-wave, volume hologram has been written. The refractive index varies as: $n(x)=n_0+\Delta n \cos(K_x)$, where $n(x)$ is the spatially varying refractive index, x is the position vector, K is the grating wavevector, and $n_0$ is the baseline refractive index of the medium. See, e.g., P. Hariharan, *Optical Holography: Principles, Techniques, and Applications*, Cambridge University Press, Cambridge, 1991, at 44.) The $\Delta n$ of a material is typically calculated from the diffraction efficiency or efficiencies of a single volume hologram or a multiplexed set of volume holograms recorded in a medium. The $\Delta n$ is associated with a medium before writing, but is observed by measurement performed after recording.

Examples of other optical articles include beam filters, beam steerers or deflectors, and optical couplers. (See, e.g., L. Solymar and D. Cooke, *Volume Holography and Volume Gratings*, Academic Press, 315–327 (1981), the disclosure of which is hereby incorporated by reference.) A beam filter separates part of an incident laser beam that is traveling along a particular angle from the rest of the beam. Specifically, the Bragg selectivity of a thick transmission hologram is able to selectively diffract light along a particular angle of incidence, while light along other angles travel undeflected through the hologram. (See, e.g., J. E. Ludman et al., "Very thick holographic nonspatial filtering of laser beams," *Optical Engineering*, Vol. 36, No. 6, 1700 (1997), the disclosure of which is hereby incorporated by reference.) A beam steerer is a hologram that deflects light incident at the Bragg angle. An optical coupler is typically a combination of beam deflectors that steer light from a source to a target. These articles, typically referred to as holographic optical elements, are fabricated by imaging a particular optical interference pattern within a recording medium, as discussed previously with respect to data storage. Medium for these holographic optical elements are capable of being formed by the techniques discussed herein for recording media or waveguides.

As mentioned previously, the material principles discussed herein are applicable not only to hologram formation, but also to formation of optical transmission devices such as waveguides. Polymeric optical waveguides are discussed for example in B. L. Booth, "Optical Interconnection Polymers," in *Polymers for Lightwave and Integrated Optics, Technology and Applications*, L. A. Hornak, ed., Marcel Dekker, Inc. (1992); U.S. Pat. No. 5,292,620; and U.S. Pat. No. 5,219,710, the disclosures of which are hereby incorporated by reference. Essentially, the recording material of the invention is irradiated in a desired waveguide pattern to provide refractive index contrast between the waveguide pattern and the surrounding (cladding) material. It is possible for exposure to be performed, for example, by a focused laser light or by use of a mask with a non-focused light source. Generally, a single layer is exposed in this manner to provide the waveguide pattern, and additional layers are added to complete the cladding, thereby completing the waveguide. The process is discussed for example at pages 235–36 of Booth, supra, and cols. 5 and 6 of U.S. Pat. No. 5,292,620. A benefit of the invention is that by using conventional molding techniques, it is possible to mold the matrix/photoimageable system mixture into a variety of shapes prior to matrix cure. For example, the matrix/photoimageable system mixture is able to be molded into ridge waveguides, wherein refractive index patterns are then written into the molded structures. It is thereby possible to easily form structures such as Bragg gratings. This feature of the invention increases the breadth of applications in which such polymeric waveguides would be useful.

The invention will be further clarified by the following examples, which are intended to be exemplary.

EXAMPLES

To fabricate the high-performance recording article, the NCO-terminated prepolymer and polyol must first be reacted to form a matrix in which the acrylate monomer, which remains unreacted, will reside.

As the reaction of the NCO-terminated prepolymer and polyol are two-component system, the NCO-terminated prepolymer, acrylate monomer, photoinitiator, and thermal stabilizers are predissolved to form a homogeneous solution before charging into one of the holding tanks of a Posiratio two-component metering, mixing and dispensing machine, available for Liquid Control Corp. The polyol, tin catalyst, and other additives are premixed and charged into another holding tank. Each tank is then degassed, adjusting dispensing of materials from the tanks to the desired amount according to the procedures outlined by Liquid Control. Precise and accurate mixing of the two components, free of entrapped air bubbles, is carried out by metering the liquid from both tanks simultaneously into a helical element static mixer.

To form a holographic recording article, the desired amount of the well-mixed solution is dispensed onto the inner surface of the bottom substrate held by one of the parallel plate. The upper substrate, which is held by the other parallel plate, is then brought down to come in contact with the solution and held at a predetermined distance from the bottom plate, according to the procedures described in U.S. Pat. No. 5,932,045 issued Aug. 3, 1999, the disclosure of which is hereby incorporated by reference. The entire set-up is held till the mixing becomes solidified to assure an optically flat article is produced.

For less soluble photoinitiators, however, mixing the isocyanate and initiator with a solvent and then stripping the solvent under vacuum can be implemented to facilitate dissolution. Alternatively, the photoinitiator/isocyanate mix can be heated provided that no other components of the formulations have been added.

A dispensing apparatus and the optical flats could also be used for making quality articles for recording digital data, but it is not necessary for plane wave data as is described in examples below. The inventors merely applied the formula between glass slides and used spacers to adjust thickness.

High performance holographic recording articles are characterized by low shrinkage, dynamic range, and sensitivity. Low shrinkage will assure non-degradation of the recorded holograms and total fidelity of the holographic data to be recovered. Low shrinkage in the range of less than 0.2% is required. The dynamic range of a holographic recording medium is typically characterized by the parameter, M/#, a measure of how many holograms of a give average diffraction efficiency can be stored in a common volume. The M/# is determined by both the refractive index contrast and thickness of a medium. Typical values of M/# are 1.5 or better.

The photosensitivity is characterized by the total exposure time required to consume the dynamic range of the media. The sensitivity is measured by the cumulative exposure time required to reach 80% of the total M/# of the recording medium. The higher the sensitivity of the material, the shorter the cumulative exposure time required to reach 80% of the total M/#. The sensitivity can be in the range of 5 to 600 seconds. The higher the sensitivity of the material, the shorter the exposure time required to the dynamic range of the media.

Details of the measurements of the recording-induced shrinkage, M/#/200 µm, and sensitivity are described in detail in Applied Physics Letters, Volume 73, Number 10, p. 1337–1339, Sep. 7, 1998, which is incorporated herein by reference. Angle-multiplexing a series of plane-wave holograms into the recording medium produces these measurements. The laser used for recording and recovery of the multiplexed holograms was spatially filtered and collimated by a lens to yield a plane-wave source of light. The light was then split into two beams by polarizing beam splitters and half-wave plates and intersected at the sample at an external angle of 44°. The power of each beam was 2 mW and the spot diameter was 4 mm. Each hologram is written with a predetermined exposure time. After recording, the material was allowed to sit in the dark for 10 minutes and then flood cured with a Xenon lamp filtered to transmit wavelengths longer than 420 nm.

Shrinkage, dynamic range (M/#/200 µm), and sensitivity were measured. The experimental system used to characterize these parameters of the media is described in Applied Physics Letters, Volume 73, Number 10, p. 1337–1339, Sep. 7, 1999 and Optics Letters, Volume 24, Number 7, p. 487, Apr. 1, 1999, which are incorporated herein by reference. In particular, the measurements are as follows.

The exotherm start, i.e., when the rise in the temperature of the material dispensed on the dish begins, which indicates the start of the reaction, was measured by a thermocouple or thermometer inserted within the material dispensed on the dish. The exotherm peak was recorded by monitoring the time when the temperature of the thermocouple or thermometer peaks.

The soft-gel state was monitored by finger pressing the material dispensed on the dish. Soft-gel state was the state when the surface of the material dispensed on the dish was not sticky and the material would not flow when the dish was tilted vertically, but the gel could still be deformed by finger pressing.

Fabrication complete, i.e., solidification, was also determined by finger pressing the material dispensed on the dish. Solidification occurred when finger pressing could not deform the material dispensed on the dish.

The shrinkage (occurring primarily in the thickness of the medium) is determined by measuring the Bragg detuning (the shift in the readout angle) of the angle multiplexed holograms. The quantitative relationship between the physical shrinkage of the material and the Bragg detuning is described in detail in the above reference, i.e., Applied Physics Letters, Volume 73, Number 10, p. 1337–1339, Sep. 7, 1998.

Dynamic range, M/#, is defined to be the sum of the square roots of the diffraction efficiencies of the multiplexed holograms. The M/# is measured by multiplexing a series of holograms with exposure times set to consume all of the photoactive material within a region of the media. Because M/# depends on the thickness of the media, the quantities listed in the examples are scaled to 200 µm thicknesses.

The sensitivity of the holographic recording media is related to the response time of the media as well as the index of refraction contrast (Δn) that is needed to achieve the determined dynamic range (M/#). The response time $t_{80}$ is defined as the time needed to use 80% of the dynamic range (M/#) of the media. The index of refraction contrast (Δn) of the media is proportional to the dynamic range and is given by:

$$\Delta n = (M/\#)/(\pi d)\lambda \cos(\theta)$$

wherein π is 3.1428571, d is the media thickness, θ is the ½ angle within the media for the intersecting beams, and λ is the laser wavelength. The sensitivity (S) is then defined to be:

$$S = \Delta n/(t_{80} \times \text{power density of the laser at the media})$$

Because samples can vary in thickness and characterizing setups may vary in intersecting angles, wavelength and laser power densities, the above equations allows one to easily calculate a sensitivity number (S) which can be used for comparison purposes.

Examples and Comparative Examples

In the examples below, the holographic performance of media formulated with stoichiometric ratios of the polyol and isocyanate are given in Comparative Examples 1–3. The holographic performance of a non-stoichiometric ratio is given in Examples 1 and 3.

Comparative Example 1

| Component 1, Tank A | Baytech WE-180 | 415.7 gm |
| --- | --- | --- |
| | Tribromophenylacrylate | 38.0 gm |
| | Irgacure-784 | 8.44 gm |
| | BHT | 210 mg |
| Component 2, Tank B | Polypropylene Oxide Triol | 577 gm |
| | t-Butylhydroperoxide | 310 µl |
| | Dibutyltindilaurate | 10.2 gm |
| Fabricate the articles | | |
| Amount metered out of component 1, Tank A | | 1.0 gm |
| Amount metered out of component 2, Tank B | | 1.3 gm |
| Ratio of component 1 (NCO) to 2 (OH) | | 1.0/1.0 |
| Exotherm starts | | 15 min |
| Soft gel | | 35 min. |
| Fabrication completed | | 3 hours |
| Optical quality of the article | | Clear |
| Shrinkage | | 0.1% |
| Dynamic range, M/#/200 µm | | 2.4 |
| Sensitivity, seconds to write 80% of the sample | | 25 |

1) Baytech WE-180, available from Bayer, is a 50/50 blend of biscyclohexylmethane diisocyanate and a NCO-terminated prepolymer based on biscyclohexylmethane diisocyanate and polytetramethylene glycol.
2) Polypropylene Oxide Triol of 1000 molecular weight.

Comparative Example 1 illustrates properties: dynamic range, shrinkage, and sensitivity that can be obtained from a typical stoichiometric ratio urethane matrix and tribromophenylacrylate as the writing monomer in a two-chemistry composition.

Comparative Example 2

| Component 1, Tank A | Baytech WE-180 | 200 gm |
|---|---|---|
| | Mondur ML | 200 gm |
| | Tribromophenylacrylate | 44.93 gm |
| | Irgacure-784 | 9.84 gm |
| | BHT | 254 mg |
| Component 2, Tank B | Polypropylene Oxide Triol | 807 gm |
| | t-Butylhydroperoxide | 310 µl |
| | Dibutyltindilaurate | 12.5 gm |
| Fabricate the articles | | |
| Amount metered out of component 1, Tank A | | 1.0 gm |
| Amount metered out of component 2, Tank B | | 1.8 gm |
| Ratio of component 1 (NCO) to 2 (OH) | | 1.0/1.0 |
| Exotherm starts | | 2 min |
| Soft gel | | 3 min. |
| Fabrication completed | | 17 min |
| Optical quality of the article | | Clear |
| Shrinkage | | 0.12% |
| Dynamic range, M/#/200 µm | | 1.8 |
| Sensitivity, seconds to write 80% of the sample | | 67 |

Mondur ML is liquid diphenylmethane diisocyanate available from Bayer.
Polypropylene Oxide Triol of 1000 molecular weight Comparative Example 2 illustrates properties: dynamic range, shrinkage, and sensitivity that can be obtained from a typical stoichiometric ratio aromatic urethane matrix and tribromophenylacrylate as the writing monomer in a two-chemistry composition.

Comparative Example 3

| Component 1, Tank A | Baytech WE-180 | 200 gm |
|---|---|---|
| | Mondur ML | 200 gm |
| | Mondur TD | 44.4 gm |
| | Pentabromoacrylate | 76.48 gm |
| | Irgacure-784 | 11.93 gm |
| | BHT | 223 mg |
| Component 2, Tank B | Polypropylene Oxide Triol | 996.5 gm |
| | t-Butylhydroperoxide | 474 µl |
| | Dibutyltindilaurate | 11.2 gm |
| Fabricate the articles | | |
| Amount metered out of component 1, Tank A | | 1.0 gm |
| Amount metered out of component 2, Tank B | | 1.84 gm |
| Ratio of component 1 (NCO) to 2 (OH) | | 1.0/1.0 |
| Exotherm starts | | 2 min |
| Soft gel | | 3 min. |
| Fabrication completed | | 15 min |
| Optical quality of the article | | Clear |
| Shrinkage | | 0.1% |
| Dynamic range, M/#/200 µm | | 2.1 |
| Sensitivity, seconds to write 80% of the sample | | 85 |

Mondur TD is toluene diisocyanate (TDI) available from Bayer.
Polypropylene Oxide Triol of 1000 molecular weight Comparative Example 2 illustrates properties: dynamic range, shrinkage, and sensitivity that can be obtained from a typical stoichiometric ratio aromatic urethane matrix and pentabromophenylacrylate, a higher refractive index compound, as the writing monomer in a two-chemistry composition.

Comparative Example 4

| Component 1, Tank A | Biuret Trimer of HDI | 292.0 gm |
|---|---|---|
| | HDI | 97.33 gm |
| | Tribromophenylacrylate | 72.24 gm |
| | Irgacure-784 | 17.65 gm |
| | BHT | 210 mg |
| Component 2, Tank B | PolyFox ™ T | 777.69 gm |
| | Polypropylene Oxide Triol | 772.34 gm |
| | t-Butylhydroperoxide | 601 µl |
| | Dibutyltindilaurate | 10.2 gm |
| Fabricate the articles | | |
| Amount metered out of component 1, Tank A | | 1.0 gm |
| Amount metered out of component 2, Tank B | | 3.26 gm |
| Ratio of component 1 (NCO) to 2 (OH) | | 1.0/1.0 |
| Exotherm starts | | 1.5 min |
| Soft gel | | 2 min. |
| Fabrication completed | | 15 min |
| Optical quality of the article | | Opaque |
| Shrinkage | | N/A |
| Dynamic range, M/#/200 µm | | N/A |
| Sensitivity, seconds to write 80% of the sample | | N/A |

Polypropylene Oxide Triol of 1000 molecular weight

Comparative Example 4 illustrates that at lower weight percents of PolyFox™ T in the composition, incompatibility occurred between PolyFox™ T and other components of the matrix when the stoichiometric amount of NCO to OH was used. That resulted in poor optical quality of the articles. No holograms could be written.

Example 1

| Component 1, Tank A | Biuret Trimer of HDI | 292.0 gm |
|---|---|---|
| | HDI | 97.4 gm |
| | Tribromophenylacrylate | 64.22 gm |
| | Irgacure-784 | 14.0 gm |
| | BHT | 210 mg |
| Component 2, Tank B | PolyFox ™ T | 817.9 gm |
| | Polypropylene Oxide Triol | 517.9 gm |
| | t-Butylhydroperoxide | 580 µl |
| | Dibutyltindilaurate | 10.2 gm |
| Fabricate the articles | | |
| Amount metered out of component 1, Tank A | | 1.0 gm |
| Amount metered out of component 2, Tank B | | 1.87 gm |
| Ratio of component 1 (NCO) to 2 (OH) | | 1.37/1.0 |
| Exotherm starts | | 1.5 min |
| Soft gel | | 2 min. |
| Fabrication completed | | 15 min |
| Optical quality of the article | | Clear |
| Shrinkage | | 0.2% |
| Dynamic range, M/#/200 µm | | 3.47 |
| Sensitivity, seconds to write 80% of the sample | | 14 |

Polypropylene Oxide Triol of 1000 molecular weight

Example 1 illustrates that: (1) matrix with high levels of fluorine moieties exhibited unexpected high optical clarity as oppose to the haziness or opacity one would expect from the incompatibility of the fluorine moieties to the matrix, (2) an increase in dynamic range of example 1 over the comparative examples was in the ranges of 45 to 90%, and (3) the non stoichiometric ratio of NCO provides self-sealing properties.

Example 2

| Component 1, Tank A | Baytech WE-180 | 200 gm |
|---|---|---|
| | HMDI | 91.91 gm |
| | Tribromophenylacrylate | 50.96 gm |
| | Irgacure-784 | 11.16 gm |
| | BHT | 283 mg |

-continued

| Component 2, Tank B | Polypropylene Oxide Triol | 876.64 gm |
| --- | --- | --- |
| | t-Butylhydroperoxide | 443 μl |
| | Dibutyltindilaurate | 12.5 gm |
| Fabricate the articles | | |
| Amount metered out of component 1, Tank A | | 1.0 gm |
| Amount metered out of component 2, Tank B | | 2.51 gm |
| Ratio of component 1 (NCO) to 2 (OH) | | 1.4/1.0 |
| Exotherm starts | | 12 min |
| Soft gel | | 31 min. |
| Fabrication completed | | 3 hours |
| Optical quality of the article | | Clear |
| Shrinkage | | 0.12% |
| Dynamic range, M/#/200 μm | | 2.1 |
| Sensitivity, seconds to write 80% of the sample | | 72 |

Polypropylene Oxide Triol of 1500 molecular weight

Example 2 illustrates a non-stoichiometric NCO to OH composition but without PolyFox™ T fluorinated polyol would provide the self-sealing, environmental protection benefits.

Demonstration of the Self-Sealing Properties of Non-Stoichiometric Formulations

To demonstrate the self-sealing properties of the non-stoichiometric media, the formulations described in Comparative Examples 1–4 and Example 1 and 2 were used to fabricate optically flat media as described above. The formulations were dispensed between substrates that were held compliant against reference optical flats. The substrates were brought to the desired separation (in these cases, yielding media with a polymer thickness of 750 μm). The matrices were allowed to harden.

Subsequently, a Zygo transmission optical interferometer was used to measure the optical transmission properties of the resulting optical articles. The optical articles were placed in 95% RH environments and their optical transmission properties were monitored (see FIGS. 1 and 2) as a function of time.

Figure 1:
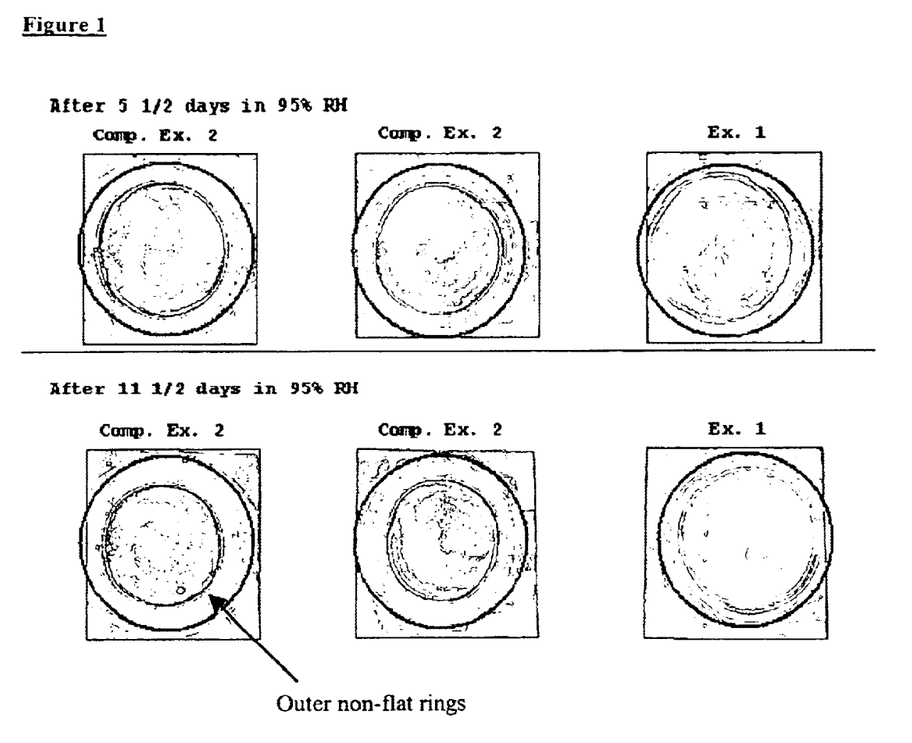
FIG. 1. Optical transmission through optically flat media of Comparative Examples 1 and 2 and Example 1.
Figure 2:
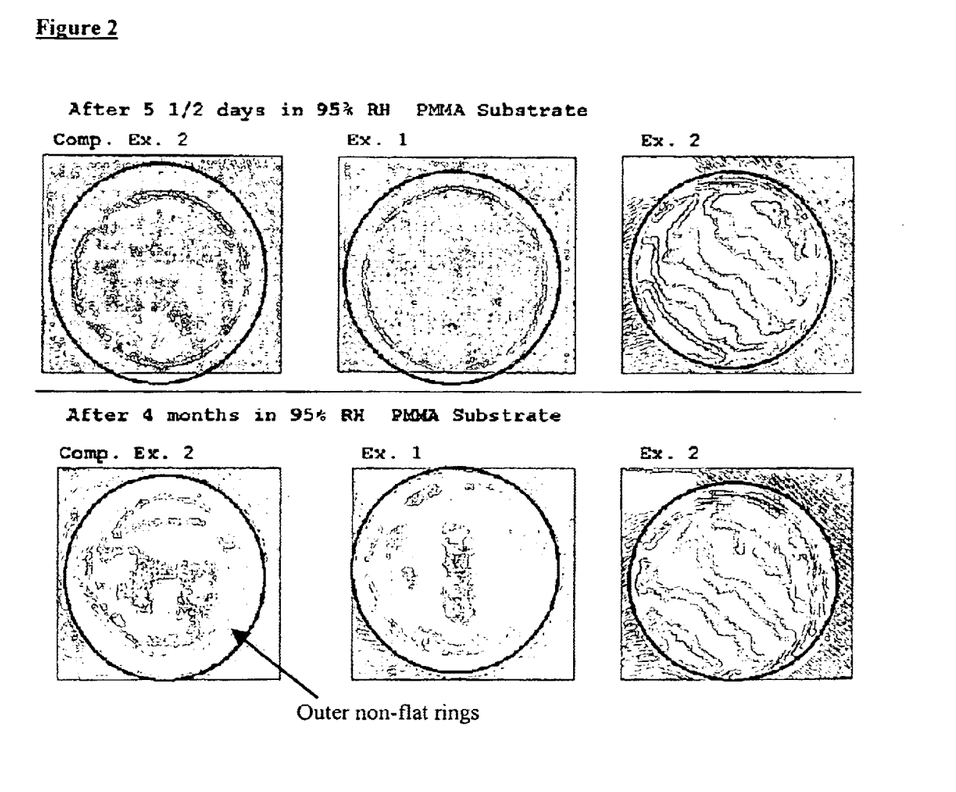
FIG. 2. Optical transmission through optically flat media of Comparative Example 1 and Examples 1 and 2.

FIGS. 1 and 2 show the results for flat disk-shaped articles fabricated with both glass (FIG. 1) and polymethylmethacrylate (PMMA) (FIG. 2) substrates having a diameter of about 76.2 mm and a thickness of 750 μm. The articles of Comparative Example 2 were made using stoichiometric ratios of NCO and OH. Therefore, no polyurea linkage is formed at the outside perimeter of the media and the transmission interferograms show the optical flatness being distorted after 11½ days in a 95% RH environment. Note that the interference rings are moving in from the edges. The interference rings are due to distortions of the optical flatness of the medium. Water infiltrating the sample either swells the material or introduces inhomogeneities into the medium's refractive index.

Example articles are glass substrates with 76.2 mm squares by 1.1 mm thick having a polymer layer of 0.75 mm thick sandwiched between substrates. The articles were placed in a 95% RH chamber. Flatness was monitored over time. Overall outer non-flat (interference) rings compromise flatness of Comparative Example 2. This is shown to approach the center with increasing magnitude. Example 1 article displays less movement in outer ring encroachment with a lesser magnitude.

The distance that the interference rings moves in from the edges represents the distance from the edge where the media is distorted. In the case where a non-stoichiometric ratio was used as in Example 1, the transmission interferogram shows the existence of a barrier to these rings (i.e. the occurrence of the rings are reduced if not eliminated). Similarly, FIG. 2 shows barrier rings in articles made using a non-stoichiometric ratio composition of Example 2.

Example articles are PMMA with 76.2 mm squares by 1.0 mm thick having a polymer layer of 0.75 mm thick sandwiched between substrates. The articles were placed in a 95% RH chamber. Flatness was monitored over time. PMMA substrates show better long term overall flatness. Outer non-flat (interference) rings compromise Comparative Example 2. This is shown to approach the center with increasing magnitude and inhomogenaity. Example 1 article displays less movement in outer ring encroachment with a lesser magnitude. Example 3 also illustrates little motion in non-flat outer ring over time.

The figures show optical transmission interferograms of a series of media fabricated by sandwiching the polymer layer between two substrates. The interferograms indicate the relative optical transmission flatness of the media. The transmission flatness is determined by both the physical flatness and the refractive index homogeneity of the media. Fringes (i.e. "striped or ringed" patterns) indicate nonuniformities in the transmission flatness.

Because in these examples we are most concerned with the infiltration of water from the edges, the regions to note are those around the circular edges of the polymer sample. The presence or lack of fringes coming in from the circular edges indicate the infiltration or barrier of water in the samples. These important features are marked in the figures.

The inference that polyurea formation improved moisture resistance is based on the excess NCO available to reaction with moisture and physical changes of the media in high humidity environment. The chemistry and formation of polyurea from NCO and moisture have been well established. Polyurea has a much higher glass temperature than the polyurethane matrix, and moisture resistance is a function of glass temperature—higher glass transition temperatures, better moisture resistance.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

This application discloses several numerical range limitations. Persons skilled in the art would recognize that the numerical ranges disclosed inherently support any range within the disclosed numerical ranges even though a precise range limitation is not stated verbatim in the specification because this invention can be practiced throughout the disclosed numerical ranges. A holding to the contrary would "let form triumph over substance" and allow the written description requirement to eviscerate claims that might be narrowed during prosecution simply because the applicants broadly disclose in this application but then might narrow their claims during prosecution. Finally, the entire disclosure of the patents and publications referred in this application are hereby incorporated herein by reference.

What is claimed is:

1. An optical article comprising a photoactive material dispersed in a polymer formed by a polymerizing reaction of a composition comprising a stoichiometrically excess amount of a polyisocyanate to a polyol, wherein the optical article is self-sealing and the optical article is selected from the group consisting of an optical waveguide and a holographic recording medium and combinations thereof.

2. An optical article comprising a photoactive material dispersed in a polymer formed by a polymerizing reaction of a composition comprising a stoichiometrically excess amount of a polyisocyanate to a polyol, wherein the optical article is self-sealing, wherein said polyol comprises a fluorine-containing polyol.

3. The optical article of claim 1, wherein the optical article further comprises an unreacted polyisocyanate.

4. The optical article of claim 1 further comprising a polyurea, wherein said polyurea is formed by a reaction of an unreacted polyisocyanate and water.

5. The optical article of claim 1, wherein the isocyanate is selected from the group consisting of diphenylmethane diisocyanate, toluene diisocyanate, hexamethylene diisocyanate, a derivative of hexamethylene diisocyanate, a methylenebiscyclohexylisocyanate, a derivative of methylenebiscyclohexylisocyanate, and combinations thereof.

6. The optical article of claim 1, wherein the polyol is selected from the group consisting of diols and triols of a fluorine-containing polyol, polytetramethylene glycol, polycaprolactone, polypropylene oxide, a polyether polyol, a polyester polyol and combinations thereof.

7. The optical article of claim 1, wherein the photoactive material is an acrylate monomer.

8. The optical article of claim 1, wherein a ratio of NCO to OH in the polyisocyanate and the polyol is in the range of about 1.01 to about 4.

9. The optical article of claim 2, wherein a ratio of NCO to OH in the polyisocyanate and the fluorine-containing polyol is in the range of about 1.1 to about 2.1.

10. A method for self-sealing an optical article comprising exposing the optical article to water and forming polyurea, the optical article comprising a photoactive material dispersed in a polymer formed by a polymerizing reaction of a composition comprising a stoichiometrically excess amount of a polyisocyanate to a polyol and the optical article is selected from the group consisting of an optical waveguide and a holographic recording medium and combinations thereof.

11. A method for self-sealing an optical article comprising exposing the optical article to water and forming polyurea, the optical article comprising a photoactive material dispersed in a polymer formed by a polymerizing reaction of a composition comprising a stoichiometrically excess amount of a polyisocyanate to a polyol, wherein said polyol comprises a fluorine-containing polyol.

12. The method of claim 10, wherein the optical article further comprises an unreacted polyisocyanate.

13. The method of claim 10, further comprising a polyurea, wherein said polyurea is formed by a reaction of an unreacted polyisocyanate and water.

14. The method of claim 10, wherein the isocyanate is selected from the group consisting of diphenylmethane diisocyanate, toluene diisocyanate, hexamethylene diisocyanate, a derivative of hexamethylene diisocyanate, a methylenebiscyclohexylisocyanate, a derivative of methylenebiscyclohexylisocyanate, and combinations thereof.

15. The method of claim 10, wherein the polyol is selected from the group consisting of diols and triols of a fluorine-containing polyol, polytetramethylene glycol, polycaprolactone, polypropylene oxide, a polyether polyol, a polyester polyol and combinations thereof.

16. The method of claim 10, wherein the photoactive material is an acrylate monomer.

17. The method of claim 10, wherein a ratio of NCO to OH in the polyisocyanate and the polyol is in the range of about 1.01 to about 4.

18. The method of claim 11, wherein a ratio of NCO to OH in the polyisocyanate and the fluorine-containing polyol is in the range of about 1.1 to about 2.1.

19. A method for manufacturing an optical article comprising dispersing a photoactive material in a composition comprising a stoichiometrically excess amount of a polyisocyanate to a polyol, polymerizing the polyisocyanate and the polyol, and forming the optical article, wherein the optical article is self-sealing and the optical article is selected from the group consisting of an optical waveguide and a holographic recording medium and combinations thereof.

20. A method for manufacturing an optical article comprising dispersing a photoactive material in a composition comprising a stoichiometrically excess amount of a polyisocyanate to a polyol, polymerizing the polyisocyanate and the polyol, and forming the optical article, wherein the optical article is self-sealing, wherein said polyol comprises a fluorine-containing polyol.

21. The method of claim 19, wherein the optical article further comprises an unreacted polyisocyanate.

22. The method of claim 19, further comprising a polyurea, wherein said polyurea is formed by a reaction of an unreacted polyisocyanate and water.

23. The method of claim 19, wherein the isocyanate is selected from the group consisting of diphenylmethane diisocyanate, toluene diisocyanate, hexamethylene diisocyanate, a derivative of hexamethylene diisocyanate, a methylenebiscyclohexylisocyanate, a derivative of methylenebiscyclohexylisocyanate, and combinations thereof.

24. The method of claim 19, wherein the polyol is selected from the group consisting of diols and triols of a fluorine-containing polyol, polytetramethylene glycol, polycaprolactone, polypropylene oxide, a polyether polyol, a polyester polyol and combinations thereof.

25. The method of claim 19, wherein the photoactive material is an acrylate monomer.

26. The method of claim 19, wherein a ratio of NCO to OH in the polyisocyanate and the polyol is in the range of about 1.01 to about 4.

27. The method of claim 20, wherein a ratio of NCO to OH in the polyisocyanate and the fluorine-containing polyol is in the range of about 1.1 to about 2.1.

* * * * *